(12) United States Patent
Reiss et al.

(10) Patent No.: US 9,340,706 B2
(45) Date of Patent: May 17, 2016

(54) MIXED ABRASIVE POLISHING COMPOSITIONS

(71) Applicant: Cabot Microelectronics Corporation, Aurora, IL (US)

(72) Inventors: Brian Reiss, Woodridge, IL (US); Jakub Nalaskowski, Aurora, IL (US); Viet Lam, Naperville, IL (US); Renhe Jia, Naperville, IL (US); Jeffrey Dysard, St. Charles, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 133 days.

(21) Appl. No.: 14/051,121

(22) Filed: Oct. 10, 2013

(65) Prior Publication Data

US 2015/0102012 A1    Apr. 16, 2015

(51) Int. Cl.
*C09G 1/02* (2006.01)
*H01L 21/306* (2006.01)
*H01L 21/02* (2006.01)

(52) U.S. Cl.
CPC ............ *C09G 1/02* (2013.01); *H01L 21/02013* (2013.01); *H01L 21/30625* (2013.01)

(58) Field of Classification Search
USPC ......................... 252/79.1, 79.4, 79.5; 51/309
See application file for complete search history.

(56) References Cited

U.S. PATENT DOCUMENTS

| | | | |
|---|---|---|---|
| 5,196,353 A | 3/1993 | Sandhu et al. | |
| 5,433,651 A | 7/1995 | Lustig et al. | |
| 5,527,370 A | 6/1996 | Kubo et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,093,649 A | 7/2000 | Roberts et al. | |
| 6,143,662 A | 11/2000 | Rhoades et al. | |
| 6,358,853 B2 | 3/2002 | Cadien et al. | |
| 6,365,520 B1 | 4/2002 | Rhoades et al. | |
| 6,443,811 B1* | 9/2002 | Nojo ........................ C09G 1/02 257/E21.244 |
| 6,559,056 B2 | 5/2003 | Hattori et al. | |
| 6,638,328 B1 | 10/2003 | Lee et al. | |
| 7,071,105 B2 | 7/2006 | Carter et al. | |
| 7,247,557 B2* | 7/2007 | Grunwald ...................... 438/633 |
| 8,314,030 B2 | 11/2012 | Park et al. | |
| 2002/0004317 A1 | 1/2002 | Cadien et al. | |
| 2002/0009955 A1 | 1/2002 | Towery et al. | |
| 2003/0200702 A1 | 10/2003 | Lee et al. | |
| 2004/0010978 A1* | 1/2004 | Uchino et al. ................... 51/307 |
| 2004/0152309 A1 | 8/2004 | Carter et al. | |
| 2004/0192172 A1 | 9/2004 | Towery et al. | |
| 2004/0203241 A1 | 10/2004 | Hampden-Smith et al. | |
| 2005/0198912 A1* | 9/2005 | Kim ..................... C09K 3/1463 51/307 |
| 2006/0234509 A1* | 10/2006 | Small et al. .................... 438/692 |
| 2007/0175104 A1* | 8/2007 | Nishiyama et al. ............. 51/307 |
| 2008/0096470 A1* | 4/2008 | Hou et al. ........................ 451/36 |
| 2010/0184359 A1 | 7/2010 | Park et al. | |
| 2010/0203729 A1* | 8/2010 | Lee et al. ...................... 438/692 |
| 2011/0062376 A1* | 3/2011 | Reiss et al. ................... 252/79.5 |
| 2012/0028466 A1 | 2/2012 | Mcconnell et al. | |
| 2012/0208344 A1 | 8/2012 | Lauter et al. | |
| 2012/0270399 A1* | 10/2012 | Shin et al. ..................... 438/692 |

\* cited by examiner

*Primary Examiner* — Shamim Ahmed
(74) *Attorney, Agent, or Firm* — Thomas Omholt; Arlene Hornilla; Ashlee Szelag

(57) ABSTRACT

The invention provides chemical-mechanical polishing compositions and methods of chemically-mechanically polishing a substrate with the chemical-mechanical polishing compositions. The polishing compositions comprise first abrasive particles, wherein the first abrasive particles are ceria particles, second abrasive particles, wherein the second abrasive particles are ceria particles, surface-modified silica particles, or organic particles, a pH-adjusting agent, and an aqueous carrier. The polishing compositions also exhibit multimodal particle size distributions.

16 Claims, No Drawings

MIXED ABRASIVE POLISHING COMPOSITIONS

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry) for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., a silicon oxide) conforms to the underlying topography of the substrate. Thus, the surface of the substrate is characterized by raised areas of the overlying oxide between trenches, which are referred to as pattern oxide. Pattern oxide is characterized by the step height of the excess oxide dielectric material lying outside of the trenches. The excess dielectric material is typically removed by a CMP process, which additionally provides a planar surface for further processing. As pattern oxide is abraded and planarity of the surface is approached, the oxide layer is then referred to as blanket oxide.

A polishing composition can be characterized according to its polishing rate (i.e., removal rate) and its planarization efficiency. The polishing rate refers to the rate of removal of a material from the surface of the substrate, and is usually expressed in terms of units of length (thickness) per unit of time (e.g., Angstroms (Å) per minute). Planarization efficiency relates to step height reduction versus amount of material removed from the substrate. Specifically, a polishing surface first contacts the "high points" of the surface and must remove material in order to form a planar surface. A process that results in achieving a planar surface with less removal of material is considered to be more efficient than a process requiring removal of more material to achieve planarity.

Often the rate of removal of the silicon oxide pattern can be rate-limiting for the dielectric polishing step in STI processes, and therefore high removal rates are desired to increase device throughput. However, if the blanket removal rate is too rapid, overpolishing of oxide in exposed trenches results in trench erosion and increased device defectivity.

A need remains for compositions and methods for chemical-mechanical polishing of silicon oxide-containing substrates that will provide useful removal rates and desirable planarization efficiency, without excessive erosion of silicon oxide within the trenches. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising (a) first abrasive particles, wherein the first abrasive particles are ceria particles, and wherein the first abrasive particles have an average particle size of about 30 nm to about 1 μm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a functionalized pyridine, benzoic acid, amino acid, or combination thereof, (d) a pH-adjusting agent, and (e) an aqueous carrier, wherein the polishing composition exhibits a multimodal particle size distribution, and wherein the pH of the polishing composition is about 3.5 to about 9.

The invention also provides a chemical-mechanical polishing composition comprising (a) first abrasive particles, wherein the first abrasive particles are ceria particles, and wherein the first abrasive particles have an average particle size of about 30 nm to about 1 μm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a polymer additive selected from polyethylene glycol (PEG), polyvinyl alcohol, poly(hydroxyethyl methacrylate), a copolymer of poly(hydroxyethyl methacrylate), cellulose, a cationic dendrimer, a monomer or homopolymer of methacryloyloxyethyl trimethylammonium, or a combination thereof, (d) a pH-adjusting agent, and (e) an aqueous carrier, wherein the polishing composition exhibits a multimodal particle size distribution, and wherein the pH of the polishing composition is about 6 to about 9.

The invention further provides a method of polishing a substrate comprising (i) providing a substrate, such as a silicon oxide layer; (ii) providing a polishing pad; (iii) providing a chemical-mechanical polishing composition comprising (a) first abrasive particles, wherein the first abrasive particles are ceria particles, and wherein the first abrasive particles have an average particle size of about 30 nm to about 1 μm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a functionalized pyridine, benzoic acid, amino acid, or combination thereof, (d) a pH-adjusting agent, and (e) an aqueous carrier, wherein the polishing composition exhibits a multimodal particle size distribution, and wherein the pH of the polishing composition is about 3.5 to about 9; (iv) contacting the substrate with the polishing pad and the chemical-mechanical polishing composition; and (v) moving the polishing pad and the chemical-mechanical polishing composition relative to the substrate, such as the silicon oxide layer on a surface of the substrate, to abrade at least a portion of the substrate to polish the substrate.

The invention still further provides a method of polishing a substrate comprising (i) providing a substrate, such as a silicon oxide layer; (ii) providing a polishing pad; (iii) providing a chemical-mechanical polishing composition comprising (a) first abrasive particles, wherein the first abrasive particles are ceria particles, and wherein the first abrasive particles have an average particle size of about 30 nm to about 1 μm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a polymer additive selected from polyethylene glycol (PEG), polyvinyl alcohol, poly(hydroxyethyl methacrylate), a copolymer of poly(hydroxyethyl methacrylate), cellulose, a cationic dendrimer, a monomer or homopolymer of methacryloyloxyethyl trimethylammonium, or a combination thereof, (d) a pH-adjusting agent, and (e) an aqueous carrier, wherein the polishing composition exhibits a multimodal particle size distribution, and wherein the pH of the polishing composition is about 6 to about 9; (iv) contacting the substrate with the polishing pad and the chemical-mechanical polishing composition; and (v) moving the polishing pad and the chemical-mechanical polishing composition relative to the substrate, such as the silicon oxide layer on a surface of the substrate, to abrade at least a portion of the substrate to polish the substrate.

DETAILED DESCRIPTION OF THE INVENTION

The invention provides chemical-mechanical polishing compositions. In one embodiment, the polishing composition can comprise, consist essentially of, or consist of (a) first abrasive particles, wherein the first abrasive particles are ceria particles, and wherein the first abrasive particles have an average particle size of about 30 nm to about 1 μm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a functionalized pyridine, benzoic acid, amino acid, or combination thereof, (d) a pH-adjusting agent, and (e) an aqueous carrier, wherein the polishing composition exhibits a multimodal particle size distribution, and wherein the pH of the polishing composition is about 3.5 to about 9.

In another embodiment, the polishing composition can comprise, consist essentially of, or consist of (a) first abrasive particles, wherein the first abrasive particles are ceria particles, and wherein the first abrasive particles have an average particle size of about 30 nm to about 1 μm and are present in the polishing composition at a concentration of about 0.005 wt. % to about 2 wt. %, (b) second abrasive particles, wherein the second abrasive particles are ceria panicles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a polymer additive selected from polyethylene glycol (PEG), polyvinyl alcohol, poly(hydroxyethyl methacrylate), a copolymer of poly(hydroxyethyl methacrylate), cellulose, a cationic dendrimer, a monomer or homopolymer of methacryloyloxyethyl trimethylammonium, or a combination thereof, (d) a pH-adjusting agent, and (e) an aqueous carrier, wherein the polishing composition exhibits a multimodal particle size distribution, and wherein the pH of the polishing composition is about 6 to about 9.

The polishing composition includes first abrasive particles. The first abrasive particles can be any suitable abrasive particles. Preferably, the first abrasive particles are ceria (e.g., cerium oxide) particles. The first abrasive particles can be any suitable type of ceria particles, e.g., fumed ceria particles, calcined ceria particles, or wet-process ceria particles (e.g., precipitated ceria particles or condensation-polymerized ceria particles, including colloidal ceria particles). Preferably, the first abrasive particles are wet-process ceria particles or calcined ceria particles. More preferably, the first abrasive particles are wet-process ceria particles.

The first abrasive particles can have any suitable average particle size. The particle size of a particle is the diameter of the smallest sphere that encompasses the particle. The particle size of the first abrasive particles can be measured using any suitable technique, for example, using laser diffraction techniques. Suitable particle size measurement instruments are commercially available, such as from Malvern Instruments (Malvern, UK). The first abrasive particles can have an average particle size of about 30 nm or more, e.g., about 35 nm or more, about 40 nm or more, about 45 nm or more, about 50 nm or more, about 55 nm or more, about 60 nm or more, about 65 nm or more, or about 70 nm or more. Alternatively, or in addition, the first abrasive particles can have an average particle size of about 1 μm or less, e.g., about 900 nm or less, about 800 nm or less, about 750 nm or less, about 500 nm or less, about 250 nm or less, about 100 nm or less, about 75 nm or less, or about 70 nm or less. Thus, the first abrasive particles can have an average particle size within a range bounded by any two of the aforementioned endpoints. For example, the first abrasive particles can have an average particle size of about 30 nm to about 1 μm, e.g., about 30 nm to about 750 nm, about 30 nm to about 500 nm, about 30 nm to about 250 nm, about 30 nm to about 100 nm, about 30 nm to about 75 nm, about 50 nm to about 500 nm, about 50 nm to about 100 nm, about 50 nm to about 75 nm, or about 50 nm to about 70 nm. Preferably, the first abrasive particles have an average particle size of about 50 nm to about 70 nm, e.g., an average particle size of about 50 nm, an average particle size of about 55 nm, an average particle size of about 60 nm, an average particle size of about 65 nm, or an average particle size of about 70 nm.

The first abrasive particles can be present in the polishing composition at any suitable concentration. For example, the first abrasive particles can be present in the polishing composition at a concentration of about 0.005 wt. % or more, e.g., about 0.01 wt. % or more, about 0.015 wt. % or more, about 0.02 wt. % or more, about 0.025 wt. % or more, about 0.03 wt. % or more, about 0.035 wt. % or more, about 0.04 wt. % or more, about 0.05 wt. % or more, about 0.075 wt. % or more, about 0.1 wt. % or more, about 0.15 wt. % or more, about 0.2 wt. % or more, about 0.25 wt. % or more, about 0.5 wt. % or more, or about 0.75 wt. % or more. Alternatively, or in addition, the first abrasive particles can be present in the polishing composition at a concentration of about 2 wt. % or less, e.g., about 1.75 wt. % or less, about 1.6 wt. % or less, about 1.5 wt. % or less, about 1.4 wt. % or less, about 1.3 wt. % or less, about 1.25 wt. % or less, about 1.2 wt. % or less, about 1.15 wt. % or less, about 1 wt. % or less, about 0.75 wt. % or less, about 0.5 wt. % or less, about 0.25 wt. % or less, or about 0.05 wt. % or less. Thus, the first abrasive particles can be present in the polishing composition at a concentration within a range bounded by any two of the aforementioned endpoints. Preferably, the first abrasive particles are present in the polishing composition at a concentration of about 0.005 wt. % to about 2 wt. %, e.g., about 0.01 wt. % to about 1 wt. %, about 0.01 wt. % to about 0.75 wt. %, about 0.01 wt. % to about 0.5 wt. %, about 0.01 wt. % to about 0.25 wt. %, or about 0.01 wt % to about 0.05 wt. %. For example, the first abrasive particles can be present in the polishing composition at a concentration of about 0.025 wt. %, about 0.05 wt. %, about 0.075 wt. %, about 0.1 wt. %, about 0.15 wt. %, about 0.2 wt. %, or about 0.25 wt. %.

The polishing composition also includes second abrasive particles. The second abrasive particles can be any suitable abrasive particles. Preferably, the second abrasive particles are metal oxide particles or organic particles. For example, the second abrasive particles can be metal oxide particles, such as ceria (e.g., cerium oxide), silica (e.g., silicon dioxide), alumina (e.g., aluminum oxide), zirconia (e.g., zirconium oxide), titania (e.g., titanium dioxide), nickel oxide, co-formed products thereof, or combinations thereof. The metal oxide particles can be any suitable type of metal oxide particles, e.g., fumed metal oxide particles, calcined metal oxide particles, or wet-process metal oxide particles (e.g., precipitated metal oxide particles or condensation-polymerized metal oxide particles, including colloidal metal oxide particles). Preferably, when the second abrasive particles are metal oxide particles, the second abrasive particles are wet-process ceria particles, calcined ceria particles, or colloidal silica particles.

The second abrasive particles can be any suitable organic particles. For example, the second abrasive particles can be gelatin, latex, cellulose, polystyrene, or polyacrylate. Preferably, when the second abrasive particles are organic particles, the second abrasive particles are gelatin particles.

The second abrasive particles can be surface-modified abrasive particles. For example, the second abrasive particles can be surface-modified particles, such as surface-modified silica particles or surface-modified organic particles, including surface-modified gelatin particles. The second abrasive particles can have any suitable surface charge. For example, the second abrasive particles can be cationic particles. By "cationic" is meant that the second abrasive particles have a positive surface charge at the pH of the polishing composition. Preferably, when the second abrasive particles are cationic particles, the second abrasive particles are cationic silica particles or cationic gelatin particles.

The second abrasive particles can have any suitable average particle size. The particle size of a particle is the diameter of the smallest sphere that encompasses the particle. The particle size of the second abrasive particles can be measured using any suitable technique, for example, using laser diffraction techniques. Suitable particle size measurement instruments are commercially available, such as from Malvern Instruments (Malvern, UK). The second abrasive particles can have an average particle size of about 1 mm or more, e.g., about 2 nm or more, about 3 nm or more, about 4 nm or more, about 5 nm or more, about 6 nm or more, about 7 nm or more, about 8 nm or more, about 9 nm or more, about 10 nm or more, about 15 nm or more, about 20 nm or more, about 25 nm or more, or about 30 nm or more. Alternatively, or in addition, the second abrasive particles can have an average particle size of about 60 nm or less, e.g., about 55 nm or less, about 50 nm or less, about 45 nm or less, about 40 am or less, about 35 nm or less, about 30 nm or less, about 25 nm or less, about 20 nm or less, about 15 nm or less, about 10 nm or less, or about 5 nm or less. Thus, the second abrasive particles can have an average particle size within a range bounded by any two of the aforementioned endpoints. For example, the second abrasive particles can have an average particle size of about 1 nm to about 60 nm, e.g., about 1 nm to about 50 nm, about 1 nm to about 40 nm, about 1 nm to about 30 nm, about 1 nm to about 25 nm, about 1 nm to about 20 nm, about 1 nm to about 10 nm, about 1 nm to about 5 nm, about 5 nm to about 40 nm, about 5 nm to about 30 nm, about 5 nm to about 20 nm, or about 5 nm to about 10 nm. Preferably, the second abrasive particles have an average particle size of about 10 nm to about 40 nm, e.g., an average particle size of about 10 nm, an average particle size of about 15 nm, an average particle size of about 20 nm, an average particle size of about 25 nm, an average particle size of about 30 nm, or an average particle size of about 35 nm. Alternatively, the second abrasive particles can have an average particle size of about 60 nm.

The second abrasive particles can be present in the polishing composition at any suitable concentration. For example, the second abrasive particles can be present in the polishing composition at a concentration of about 0.005 wt. % or more, e.g., about 0.01 wt. % or more, about 0.015 wt. % or more, about 0.02 wt. % or more, about 0.025 wt. % or more, about 0.03 wt. % or more, about 0.035 wt. % or more, about 0.04 wt. % or more, about 0.05 wt. % or more, about 0.075 wt. % or more, about 0.1 wt. % or more, about 0.15 wt. % or more, about 0.2 wt. % or more, about 0.25 wt. % or more, about 0.5 wt. % or more, or about 0.75 wt. % or more. Alternatively, or in addition, the second abrasive particles can be present in the polishing composition at a concentration of about 2 wt. % or less, e.g., about 1.75 wt. % or less, about 1.6 wt. % or less, about 1.5 wt. % or less, about 1.4 wt. % or less, about 1.3 wt. % or less, about 1.25 wt. % or less, about 1.2 wt. % or less, about 1.15 wt. % or less, about 1 wt. % or less, about 0.75 wt. % or less, about 0.5 wt. % or less, about 0.25 wt. % or less, or about 0.05 wt. % or less. Thus, the second abrasive particles can be present in the polishing composition at a concentration within a range bounded by any two of the aforementioned endpoints. Preferably, the second abrasive particles are present in the polishing composition at a concentration of about 0.005 wt. % to about 2 wt. %, e.g., about 0.01 wt. % to about 1 wt. %, about 0.01 wt. % to about 0.75 wt. %, about 0.01 wt. % to about 0.5 wt. %, about 0.01 wt. % to about 0.25 wt. %, or about 0.01 wt. % to about 0.05 wt. %. For example, the second abrasive particles can be present in the polishing composition at a concentration of about 0.025 wt. %, about 0.05 wt. %, about 0.075 wt. %, about 0.1 wt. %, about 0.15 wt. %, about 0.2 wt. %, or about 0.25 wt. %.

The polishing composition optionally may contain additional abrasive particles (e.g., third abrasive particles, fourth abrasive particles, fifth abrasive particles, etc.). The additional abrasive particles can be any suitable abrasive particles. For example, the additional abrasive particles can be metal oxide abrasive particles of ceria (e.g., cerium oxide), zirconia (e.g., zirconium oxide), silica (e.g., silicon dioxide), alumina (e.g., aluminum oxide), titania (e.g., titanium dioxide), germania (e.g., germanium dioxide, germanium oxide), magnesia (e.g., magnesium oxide), nickel oxide, co-formed products thereof, or combinations thereof. Alternatively, the additional abrasive particles can be organic particles of gelatin, latex, cellulose, polystyrene, or polyacrylate.

The additional abrasive particles can have any suitable particle size. The particle size of a particle is the diameter of the smallest sphere that encompasses the particle. The particle size of the additional abrasive particles can be measured using any suitable technique, for example, using laser diffraction techniques. Suitable particle size measurement instruments are commercially available, such as from Malvern Instruments (Malvern, UK). For example, the additional abrasive particles can have an average particle size of about 1 nm to about 1 µm, e.g., about 1 nm to about 500 nm, about 1 nm to about 300 nm, about 1 nm to about 150 nm, about 1 nm to about 100 nm, about 1 nm to about 50 nm, about 1 nm to about 30 nm, about 30 nm to about 1 µm, about 30 nm to about 500 nm, about 30 nm to about 250 nm, about 30 nm to about 100 nm, about 50 nm to about 100 nm, about 50 nm to about 250 nm, or about 50 nm to about 500 nm.

The additional abrasive particles can be present in the polishing composition at any suitable concentration. For example, the additional abrasive particles (i.e., the third abrasive particles, fourth abrasive particles, fifth abrasive particles, etc., in total) can be present in the polishing composition at a concentration of about 0.005 wt. % to about 2 wt. %, e.g., about 0.01 wt. % to about 1 wt. %, about 0.01 wt. % to about 0.5 wt. %, about 0.01 wt. % to about 0.25 wt. %, or about 0.01 wt. % to about 0.05 wt. %.

Desirably, the polishing composition contains a low content of abrasive particles (i.e., a low solids content). A low solids content desirably allows for useful removal rates of the substrate being polished while minimizing defectivity and excessive removal rates of other components of the substrate that are observed with higher abrasive levels (e.g., greater than about 5 wt. % solids content). Thus, the polishing composition desirably comprises first abrasive particles, second abrasive particles, and any additional abrasive particles at a combined (total) concentration of about 0.01 wt. % to about 5 wt. %, e.g., about 0.05 wt. % to about 4 wt. %, about 0.075 wt. % to about 3 wt. %, or about 0.1 wt. % to about 2 wt. %. Preferably, the polishing composition comprises first abrasive particles and second abrasive particles, and no additional abrasive particles.

The first abrasive particles and the second abrasive particles can be present in the polishing composition at any suitable ratio. The ratio of the first abrasive particles to the second abrasive particles is determined on a weight (concentration) basis. In particular, the ratio represents the weight percentage of the first abrasive particles present in the polishing composition as compared to the weight percentage of the second abrasive particles present in the polishing composition. The ratio of the concentration of the first abrasive particles present in the polishing composition to the concentration of the second abrasive particles present in the polishing composition can be about 1:10 or higher, e.g., about 1:5 or higher, about 1:3 or higher, about 1:2 or higher, or about 1:1 or higher. Alternatively, or in addition, the ratio of the concentration of the first abrasive particles present in the polishing composition to the concentration of the second abrasive particles present in the polishing composition can be about 30:1 or lower, e.g., about 20:1 or lower, about 15:1 or lower, about 10:1 or lower, about 5:1 or lower, about 2:1 or lower, about 1.5:1 or lower, about 1:1 or lower, or about 1:5 or lower. Thus, the ratio of the concentration of the first abrasive particles present in the polishing composition to the concentration of the second abrasive particles present in the polishing composition can be within a range bounded by any two of the aforementioned endpoints. For example, the ratio of the concentration of the first abrasive particles present in the polishing composition to the concentration of the second abrasive particles present in the polishing composition can be about 1:10 to about 1:1, about 1:10 to about 1:5, about 1:10 to about 1:3, about 1:5 to about 1:1, about 1:3 to about 1:1, about 1:5 to about 1:3, about 1:1 to about 30:1, about 1:1 to about 20:1, about 1:1 to about 15:1, about 1:1 to about 10:1, about 1:1 to about 5:1, about 1:1 to about 2:1, or about 1:1 to about 1.5:1.

When the second abrasive particles are ceria particles, and when the second abrasive particles have a particle size of 20 nm to 40 nm, the ratio of the concentration of the first abrasive particles present in the polishing composition to the concentration of the second abrasive particles present in the polishing composition is preferably about 1:1 to about 5:1 and more preferably about 1:1 to about 1.5:1.

When the second abrasive particles are ceria particles, and when the second abrasive particles have a particle size of about 1 nm to about 15 nm, the ratio of the concentration of the first abrasive particles present in the polishing composition to the concentration of the second abrasive panicles present in the polishing composition is preferably about 1:1 to about 10:1, more preferably about 3:1 to about 6:1, and most preferably about 5:1.

When the second abrasive particles are silica particles (e.g., surface-modified silica particles, or cationic silica particles), the ratio of the concentration of the first abrasive particles present in the polishing composition to the concentration of the second abrasive particles present in the polishing composition is preferably about 1:1 to about 15:1 and more preferably about 10:1.

When the second abrasive particles are organic particles (e.g., gelatin, latex, cellulose, polystyrene, or polyacrylate particles), the ratio of the concentration of the first abrasive particles present in the polishing composition to the concentration of the second abrasive particles present in the polishing composition is preferably about 1:1 to about 30:1 and more preferably about 20:1.

The first abrasive particles, second abrasive particles, and any additional abrasive particles desirably are suspended in the polishing composition, more specifically in the aqueous carrier of the polishing composition. When the first, second, and additional abrasive particles are suspended in the polishing composition, the first, second, and additional abrasive particles preferably are colloidally stable. The term colloid refers to the suspension of abrasive particles in the aqueous carrier. Colloidal stability refers to the maintenance of that suspension over time. In the context of this invention, abrasive particles are considered colloidally stable if, when the abrasive particles are placed into a 100 ml graduated cylinder and allowed to stand unagitated for a time of 2 hours, the difference between the concentration of panicles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). The value of [B]-[T]/[C] desirably is less than or equal to 0.3, and preferably is less than or equal to 0.1.

The polishing composition exhibits a multimodal particle size distribution. As used herein, the term "multimodal" means that the polishing composition exhibits an average particle size distribution having at least 2 maxima (e.g., 2 or more maxima, 3 or more maxima, 4 or more maxima, or 5 or more maxima). Preferably, the polishing composition exhibits a bimodal particle size distribution, i.e., the polishing composition exhibits a particle size distribution having 2 average particle size maxima. The terms "maximum" and "maxima" mean a peak or peaks in the particle size distribution. The peak or peaks correspond to the average particle sizes described herein for the first, second, and any additional abrasive particles. Thus, for example, when the polishing composition contains first abrasive particles and second abrasive particles, with no additional abrasive particles, then a plot of the number of particles versus particle size will reflect a bimodal particle size distribution, with a first peak in the particle size range of about 30 nm to about 1 μm and a second peak in the particle size range of about 1 nm to about 60 nm.

The polishing composition can have any suitable pH. Typically, the polishing composition has a pH of about 3 or greater. Also, the pH of the polishing composition typically is about 9 or less. For example, the pH can be in the range of about 3.5 to about 9, e.g., a pH of about 3.5, a pH of about 4, a pH of about 4.5, a pH of about 5, a pH of about 5.5, a pH of about 6, a pH of about 7, a pH of about 8, a pH of about 9, or a pH in a range defined by any two of these pH values. Alternatively, the pH can be in the range of about 6 to about 9, e.g., a pH of about 6.5, a pH of about 7, a pH of about 7.5, a pH of about 8, a pH of about 8.5, a pH of about 9, or a pH in a range defined by any two of these pH values.

The pH of the polishing composition can be achieved and/or maintained by any suitable means. More specifically, the polishing composition can further comprise a pH adjustor, a pH buffering agent, or a combination thereof. Desirably, the polishing composition includes a pH-adjusting agent. The pH-adjusting agent can be any suitable pH-adjusting agent. For example, the pH-adjusting agent can be an alkyl amine, an alcohol amine, quaternary amine hydroxide, ammonia, or a combination thereof. For example, the pH-adjusting agent can be triethanolamine, tetramethylammonium hydroxide (TMAH or TMA-OH), or tetraethylammonium hydroxide (TEAH or TEA-OH). Preferably, the pH-adjusting agent is triethanolamine.

The pH-adjusting agent can be present in the polishing composition in any suitable concentration. Desirably, the pH-adjusting agent is present in the polishing composition at a sufficient concentration to achieve and/or maintain the pH of the polishing composition within the pH ranges set forth herein, e.g., in the range of about 3 to about 9, in the range of about 3.5 to about 9, or in the range of about 6 to about 9. For example, the pH-adjusting agent can be present in the polishing composition at a concentration of about 10 ppm to about 300 ppm, e.g., about 50 ppm to about 200 ppm, or about 100 ppm to about 150 ppm.

The pH buffering agent can be any suitable buffering agent. For example, the pH buffering agent can be a phosphate, sulfate, acetate, borate, ammonium salt, and the like. The polishing composition can comprise any suitable concentration of a pH buffering agent, provided that a suitable concentration is used to achieve and/or maintain the pH of the polishing composition within the pH ranges set forth herein, e.g., about 3 to about 9, about 3.5 to about 9, or about 6 to about 9.

The polishing composition includes an aqueous carrier. The aqueous carrier contains water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N,N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The polishing composition further comprises (a) a functional pyridine, benzoic acid, amino acid, or combination thereof, and/or (b) a polymer additive.

The functional pyridine, benzoic acid, or amino acid can be any suitable functional pyridine, benzoic acid, or amino acid. For example, the polishing composition can include a functional pyridine such as picolinic acid or picolylamine; a benzoic acid such as 4-hydroxybenzoic acid, 2,3-dihydroxybenzoic acid, 2,4-dihydroxybenzoic acid, 2,4,6-trihydroxybenzoic acid, salicylic acid, or 4-aminosalicylic acid; an amino acid such as proline, glutamic acid, or aspartic acid; or any combination thereof. Preferably, the functional pyridine, benzoic acid, or amino acid is picolinic acid.

The functional pyridine, benzoic acid, amino acid, or combination thereof can be present in the polishing composition in any suitable concentration. For example, the functional pyridine, benzoic acid, amino acid, or combination thereof can be present in the polishing composition at a concentration of about 2000 ppm or less, e.g., about 1750 ppm or less, about 1500 ppm or less, about 1250 ppm or less, about 1000 ppm or less, about 750 ppm or less, about 500 ppm or less, about 400 ppm or less, or about 300 ppm or less. Alternatively, or in addition, the functional pyridine, benzoic acid, amino acid, or combination thereof can be present in the polishing composition at a concentration of about 50 ppm or more, e.g., about 60 ppm or more, about 70 ppm or more, about 75 ppm or more, about 85 ppm or more, about 100 ppm or more, about 115 ppm or more, about 125 ppm or more, about 150 ppm or more, about 175 ppm or more, about 200 ppm or more, about 225 ppm or more, or about 250 ppm or more. Thus, the functional pyridine, benzoic acid, amino acid, or combination thereof can be present in the polishing composition at a concentration within a range bounded by any two of the aforementioned endpoints. Preferably, the functional pyridine, benzoic acid, amino acid, or combination thereof is present in the polishing composition at a concentration of about 50 ppm to about 2000 ppm, e.g., about 50 ppm to about 15×00 ppm, about 100 ppm to about 1000 ppm, about 100 ppm to about 750 ppm, about 100 ppm to about 500 ppm, about 250 ppm to about 500 ppm, or about 250 ppm to about 750 ppm.

The polymer additive can be any suitable polymer additive. For example, the polymer additive can be polyethylene glycol (PEG), such as functionalized PEG or hydrophobically-modified PEG, polyvinyl alcohol, poly(hydroxyethyl methacrylate), a copolymer of poly(hydroxyethyl methacrylate), cellulose, such as hydroxypropylcellulose or hydroxyethylcellulose, a cationic dendrimer, a monomer or homopolymer of methacryloyloxyethyl trimethylammonium, or a combination thereof. Desirably, the polymer additive is PEG 8000 or a homopolymer of methacryloyloxyethyl trimethylammonium chloride (e.g., polyMADQUAT).

The polishing composition can comprise any suitable concentration of one or more polymer additives. Preferably, the polishing composition comprises about to about 5 ppm to about 2000 ppm of the polymer additive(s). For example, the one or more polymer additives can be present in the polishing composition at a concentration of about 10 ppm to about 2000 ppm, e.g., about 15 ppm to about 1750 ppm, about 20 ppm to about 1500 ppm, or about 20 ppm to about 1000 ppm.

The polishing composition optionally further comprises one or more corrosion inhibitors (i.e., film-forming agents). The corrosion inhibitor can be any suitable corrosion inhibitor for any component(s) of the substrate. For the purposes of this invention, a corrosion inhibitor is any compound, or mixture of compounds, that facilitates the formation of a passivation layer (i.e., a dissolution-inhibiting layer) on at least a portion of the surface being polished. Suitable corrosion inhibitors include, but are not limited to, lysine, and azole compounds, such as benzotriazole (BTA), methyl-benzotriazole (m-BTA), and 1,2,4-triazole (TAZ). Preferably, if a corrosion inhibitor is included in the polishing composition, the corrosion inhibitor is BTA or lysine.

The polishing composition can comprise any suitable concentration of the corrosion inhibitor(s). Generally, the polishing composition comprises about 0.005 wt. % to about 1 wt. % (e.g., about 0.01 to about 0.5 wt. %, or about 0.02 to about 0.2 wt. %) of the corrosion inhibitor(s).

The polishing composition optionally further comprises one or more other additives. The polishing composition can comprise a surfactant and/or rheological control agent, including viscosity enhancing agents and coagulants (e.g. polymeric rheological control agents, such as, for example, urethane polymers), a dispersant, a biocide (e.g., KATHON™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., first abrasive particles; second abrasive particles; functionalized pyridine, benzoic acid, or amino acid; polymer additive; pH-adjusting agent, etc.) as well as any combination of ingredients (e.g., first abrasive particles; second abrasive particles; functionalized pyridine, benzoic acid, or amino acid; polymer additive; pH-adjusting agent, etc.).

For example, the functionalized pyridine, benzoic acid, amino acid, or combination thereof can be added to water at the desired concentration(s). The pH can then be adjusted (as necessary) to be in the range of about 3.5 to about 9, and the first and second abrasive particles can be added to the mixture at the desired concentration to form the polishing composition. Alternatively, the polymer additive can be added to water at the desired concentration, the pH can then be adjusted (as necessary) to be in the range of about 6 to about 9, and the first and second abrasive particles can be added to the mixture at the desired concentration to form the polishing composition.

The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise first and second abrasive particles, a functionalized pyridine, benzoic acid, amino acid, or combination thereof, a pH-adjusting agent, and water, in amounts such that, upon dilution of the concentrate with an appropriate amount of water, each component of the polishing composition will be present in the polishing composition in an amount within the appropriate range recited above for each component. Alternatively, the polishing composition concentrate can comprise first and second abrasive particles, a polymer additive, a pH-adjusting agent, and water, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 nm of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides methods of polishing a substrate with the polishing compositions described herein. The methods of polishing a substrate comprise (i) providing a substrate; (ii) providing a polishing pad; (iii) providing an aforementioned chemical-mechanical polishing composition; (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

In particular, the invention further provides a method of chemically-mechanically polishing a substrate comprising (i) providing a substrate; (ii) providing a polishing pad; (iii) providing a chemical-mechanical polishing composition comprising, consisting essentially of, or consisting of (a) first abrasive particles, wherein the first abrasive particles are ceria particles, and wherein the first abrasive particles have an average particle size of about 30 nm to about 1 µm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a functionalized pyridine, benzoic acid, amino acid, or combination thereof, (d) a pH-adjusting agent, and (e) an aqueous carrier, wherein the polishing composition exhibits a multimodal particle size distribution, and wherein the pH of the polishing composition is about 3.5 to about 9; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

The invention also provides a method of chemically-mechanically polishing a substrate comprising (i) providing a substrate; (ii) providing a polishing pad; (iii) providing a chemical-mechanical polishing composition comprising, consisting essentially of, or consisting of (a) first abrasive particles, wherein the first abrasive particles are ceria particles, and wherein the first abrasive particles have an average particle size of about 30 nm to about 1 µm and are present in the polishing composition at a concentration of about 0.005 wt. % to about 2 wt. %, (b) second abrasive particles, wherein the second abrasive particles are ceria particles, surface-modified silica particles, or organic particles, and wherein the second abrasive particles have an average particle size of about 1 nm to about 60 nm and are present in the polishing composition at a concentration of about 0.005 wt. % to about 2 wt. %, (c) a polymer additive selected from polyethylene glycol (PEG), polyvinyl alcohol, poly(hydroxyethyl methacrylate), a copolymer of poly(hydroxyethyl methacrylate), cellulose, a cationic dendrimer, a monomer or homopolymer of methacryloyloxyethyl trimethylammonium, or a combination thereof, (d) a pH-adjusting agent, and (e) an aqueous carrier, wherein the polishing composition exhibits a multimodal particle size distribution, and wherein the pH of the polishing composition is about 6 to about 9; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

The polishing compositions of the invention are useful for polishing any suitable substrate. The polishing compositions are particularly useful in the polishing of a substrate comprising a silicon oxide layer. Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The substrate can further comprise at least one other layer, e.g., an insulating layer. The insulating layer can be a metal oxide, porous metal oxide, glass, organic polymer, fluorinated organic polymer, or any other suitable high or low-κ insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

In accordance with the invention, a substrate can be planarized or polished with the polishing composition described herein by any suitable technique. The polishing methods of the invention are particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the silicon oxide, or one or more of the substrate materials described herein, with the polishing composition and typically the polishing pad to polish the substrate. Any suitable polishing conditions can be used to polish a substrate according to the invention. Preferably, the down force, i.e., the force with which the substrate contacts the polishing pad with the polishing composition, can be been about 6.89 kPa (1 psi) to about 41.37 kPa (6 psi), the platen speed can be about 15 rpm to about 120 rpm, the head speed can be about 10 rpm to about 115 rpm, and the polishing composition flow can be about 100 mL/min to about 400 mL/min.

A substrate can be planarized or polished with the chemical-mechanical polishing composition in conjunction with any suitable polishing pad (e.g. polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example demonstrates the effectiveness of a polishing composition having first and second abrasive particles and having a multimodal particle size distribution on the removal rate, planarization efficiency, within-wafer non-uniformity (WIWNU), and step height reduction for silicon oxide.

Tetraethoxysilane (TEOS) and high density plasma (HDP) oxide blanket wafers were polished with six polishing compositions (i.e., Polishing Compositions 1A-1F) using a conventional CMP apparatus. Each of Polishing Compositions 1A-1D contained wet-process ceria having an average particle size of 60 nm (i.e., first abrasive particles) and wet-process ceria having an average particle size of 30 nm (i.e., second abrasive particles), in the amounts listed in Table 1. Polishing Compositions 1A-1D also contained 500 ppm picolinic acid and water and were pH-adjusted to pH 4 using triethanolamine. Polishing Composition 1E contained 12.5 wt. % fumed silica and water, and was adjusted to pH 10-11 with potassium hydroxide (KOH). Polishing Composition 1F contained 0.28 wt. % wet-process ceria having an average particle size of 60 nm, 216 ppm picolinic acid, 1000 ppm polyethylene glycol (PEG 8000), and water, and was adjusted to pH 4 with tetramethylammonium hydroxide (TMAH).

Tetraethoxysilane (TEOS) pattern wafers were also polished for 45 seconds with Polishing Compositions 1A-1F. The TEOS pattern wafers had a 500 μm feature size with 50% density.

The substrates were polished with Polishing Compositions 1A-1F under the same polishing conditions. In particular, the substrates were polished on a Mirra™ polisher (Applied Materials) with an IC 1010™ pad (Dow Chemical). The polishing parameters were as follows: 20.68 kPa (3 psi) down force, 100 rpm platen speed, 85 rpm head speed, and 150 mL/min polishing composition flow. Following polishing, the removal rates of the blanket silicon oxide, specifically TEOS and HDP, were determined in Å/min, and the remaining TEOS step heights were determined in Å. The results are summarized in Table 1. The removal rates and remaining step heights shown in Table 1 have been normalized to the removal rates and step height for Polishing Composition 1E.

The within-wafer non-uniformity (WIWNU) was also determined for the chemical-mechanical polishing compositions as a measure of polishing uniformity. The WIWNUL is a percentage calculated by dividing the standard deviation of removal rate by the average removal rate over the substrate and multiplying by 100. The results are summarized in Table 1.

TABLE 1

Blanket Silicon Oxide Removal Rates and WIWNU, and Remaining Silicon Oxide Step Height, as a Function of Abrasive Particles

| Polishing Composition | First Abrasive Particles (wt. %) | Second Abrasive Particles (wt. %) | TEOS Removal Rate | WIWNU | HDP Removal Rate | WIWNU | Remaining TEOS Step Height |
|---|---|---|---|---|---|---|---|
| 1A (inventive) | 0.1 | 0.1 | 1.9 | 3.2 | 2.3 | 8.3 | 0.87 |
| 1B (inventive) | 0.04 | 0.16 | 0.8 | 6.8 | 0.5 | 9 | 0.83 |
| 1C (inventive) | 0.12 | 0.08 | 1.8 | 2.9 | 2.1 | 8.6 | 0.93 |
| 1D (inventive) | 0.02 | 0.18 | 0.3 | 7.8 | 0.2 | 9.7 | 1.12 |
| 1E (comparative) | 12.5 | — | 1 | 5.4 | 1 | 6.6 | 1 |
| 1F (comparative) | 0.28 | — | 1.15 | 12.9 | 1.64 | 9.7 | 1.03 |

These results demonstrate that a polishing composition comprising first abrasive particles (i.e., wet-process ceria particles having an average particle size of 60 nm) and second abrasive particles (i.e., wet-process ceria particles having an average particle size of 30 nm), and having a multimodal particle size distribution (i.e., a bimodal particle size distribution having maxima at 60 nm and 30 nm), is particularly effective for polishing substrates comprising a silicon oxide layer (i.e., TEOS and HDP). In particular, Polishing Compositions 1A and 1C exhibited blanket removal rates for TEOS and HDP which were greater than the TEOS and HDP removal rates exhibited by Polishing Compositions 1E and 1F, which contained a greater amount of abrasive particles, but did not contain second abrasive particles, and did not exhibit a multimodal particle size distribution. Each of Polishing Compositions 1A-1D also exhibited reduced WIWNU on TEOS as compared to Polishing Composition 1F, and Polishing Compositions 1A-1C exhibited reduced WIWNU on HDP as compared to Polishing Composition 1F. Polishing Compositions 1A and 1C also exhibited reduced WIWNU on TEOS as compared to Polishing Composition 1E. In addition, Polishing Compositions 1A-1C desirably removed more TEOS step height during polishing (i.e., Polishing Compositions 1A-1C had less TEOS step height remaining after polishing), even though Polishing Compositions 1A-1C had lower solids concentrations as compared to Polishing Compositions 1E and 1F (i.e., lower total concentration of abrasive particles).

EXAMPLE 2

This example demonstrates the effectiveness of a polishing composition having first and second abrasive particles and having a multimodal particle size distribution on the removal rate, planarization efficiency, within-wafer non-uniformity (WIWNU), and step height reduction for silicon oxide.

Tetraethoxysilane (TEOS) and high density plasma (HDP) oxide blanket wafers were polished with four polishing compositions (i.e., Polishing Compositions 2A-2D) using a conventional CMP apparatus. Each of Polishing Compositions 2A-2B contained calcined ceria having an average particle size of 90 nm (i.e., first abrasive particles) and wet-process ceria having an average particle size of 60 nm (i.e., second abrasive particles), in the amounts listed in Table 2. Polishing Compositions 2A-2B also contained 500 ppm picolinic acid and water and were pH-adjusted to pH 4 using triethanolamine. Polishing Composition 2C contained 12.5 wt. % fumed silica and water, and was adjusted to pH 10-11 with potassium hydroxide (KOH). Polishing Composition 2D contained 0.2 wt. % of wet-process ceria having an average particle size of 60 nm, 200 ppm picolinic acid, 50 ppm polyethyleneglycol (PEG 8000) and water, and was adjusted to pH 4 with triethanolamine.

High density plasma (HDP) oxide pattern wafers were also polished for 60 seconds with Polishing Compositions 2A-2D. The HDP pattern wafers had an 1800 µm feature size with 50% density.

The substrates were polished with Polishing Compositions 2A-2D under the same polishing conditions. In particular, the substrates were polished on a Mirra™ polisher (Applied Materials) with an IC 1010™ pad (Dow Chemical). The polishing parameters were as follows: 20.68 kPa (3 psi) down force, 100 rpm platen speed, 85 rpm head speed, and 150 mL/min polishing composition flow. Following polishing, the removal rates of the blanket silicon oxide, specifically TEOS and HDP, were determined in Å/min, and the remaining HDP step heights were determined in Å. The results are summarized in Table 2. The removal rates and remaining step heights shown in Table 2 have been normalized to the removal rates and step height for Polishing Composition 2C.

The within-wafer non-uniformity (WIWNU) was also determined for the chemical-mechanical polishing compositions, and the results are summarized in Table 2.

TABLE 2

Blanket Silicon Oxide Removal Rates and WIWNU, and Remaining Silicon Oxide Step Height, as a Function of Abrasive Particles

| Polishing Composition | First Abrasive Particles (wt. %) | Second Abrasive Particles (wt. %) | TEOS Removal Rate | WIWNU | HDP Removal Rate | WIWNU | Remaining HDP Step Height |
|---|---|---|---|---|---|---|---|
| 2A (inventive) | 0.1 | 0.1 | 1.9 | 4.9 | 2.38 | 4.4 | 0.75 |
| 2B (inventive) | 0.02 | 0.18 | 1.63 | 7.6 | 2.28 | 3.8 | — |
| 2C (comparative) | 12.5 | — | 1 | 5.4 | 1 | 6.0 | 1 |
| 2D (comparative) | 0.2 | — | 1.46 | 9.8 | 2.08 | 6.2 | 0.94 |

These results demonstrate that a polishing composition comprising first abrasive particles (i.e., calcined ceria particles having an average particle size of 90 nm) and second abrasive particles (i.e., wet-process ceria particles having an average particle size of 60 mm), and having a multimodal particle size distribution (i.e., a bimodal particle size distribution having maxima at 90 nm and 60 nm), is particularly effective for polishing substrates comprising a silicon oxide layer (i.e., TEOS and HDP). In particular, Polishing Compositions 2A and 2B exhibited blanket removal rates for TEOS and HDP that were greater than the TEOS and HDP removal rates exhibited by Polishing Compositions 2D and 2C, which contained the same or a greater amount of abrasive particles, but did not contain second abrasive particles, and did not exhibit a multimodal particle size distribution. Polishing Compositions 2A and 2B exhibited reduced WIWNU on HDP as compared to Polishing Compositions 2C and 2D. Polishing Composition 2A also exhibited reduced WIWNU on TEOS as compared to Polishing Compositions 2C and 2D, and Polishing Composition 2B exhibited reduced WIWNU on TEOS as compared to Polishing Composition 2D. In addition, Polishing Composition 2A desirably removed more HDP step height during polishing (i.e., Polishing Compositions 2A had less HDP step height remaining after polishing), even though Polishing Composition 2A had lower solids concentration as compared to Polishing Composition 2C.

EXAMPLE 3

This example demonstrates the effectiveness of a polishing composition having first and second abrasive particles and having a multimodal particle size distribution on the removal rate, planarization efficiency, within-wafer non-uniformity (WIWNU), and step height reduction for silicon oxide.

Tetraethoxysilane (TEOS) and high density plasma (HDP) oxide blanket wafers were polished with four polishing compositions (i.e., Polishing Compositions 3A-3D) using a conventional CMP apparatus. Each of Polishing Compositions 3A-3B contained wet-process ceria having an average particle size of 60 nm (i.e., first abrasive particles) and wet-process ceria having an average particle size of 10 nm (i.e., second abrasive particles), in the amounts listed in Table 3. Polishing Compositions 3A-3B also contained 500 ppm picolinic acid and water and were pH-adjusted to pH 4 using triethanolamine. Polishing Composition 3C contained 12.5 wt. % fumed silica and water, and was adjusted to pH 10-11 with potassium hydroxide (KOH). Polishing Composition 3D contained 0.2 wt. % of wet-process ceria having an average particle size of 60 nm, 200 ppm picolinic acid, 50 ppm polyethyleneglycol (PEG 8000) and water, and was adjusted to pH 4 with triethanolamine.

High density plasma (HDP) oxide pattern wafers were also polished for 60 seconds with Polishing Compositions 3A-3D. The HDP pattern wafers had a 100 µm feature size with 50% density.

The substrates were polished with Polishing Compositions 3A-3D under the same polishing conditions. In particular, the substrates were polished on a Mirra™ polisher (Applied Materials) with an IC 1010™ pad (Dow Chemical). The polishing parameters were as follows: 20.68 kPa (3 psi) down force, 100 rpm platen speed, 85 rpm head speed, and 150 mL/min polishing composition flow. Following polishing, the removal rates of the blanket silicon oxide, specifically TEOS and HDP, were determined in Å/min, and the remaining HDP step heights were determined in Å. The results are summarized in Table 3. The removal rates and remaining step heights shown in Table 3 have been normalized to the removal rates and step heights for Polishing Composition 3C.

The within-wafer non-uniformity (WIWNU) was also determined for the chemical-mechanical polishing compositions, and the results are summarized in Table 3.

These results demonstrate that a polishing composition comprising first abrasive particles (i.e., wet-process ceria particles having an average particle size of 60 nm) and second abrasive particles (i.e., wet-process ceria particles having an average particle size of 10 nm), and having a multimodal particle size distribution (i.e., a bimodal particle size distribution having maxima at 60 nm and 10 nm), is particularly effective for polishing substrates comprising a silicon oxide layer (i.e., TEOS and HDP). In particular, Polishing Compositions 3A and 3B exhibited blanket removal rates for TEOS which were greater than the TEOS removal rate exhibited by Polishing Composition 3C, which contained a greater amount of abrasive particles, did not contain second abrasive particles, and did not exhibit a multimodal particle size distribution. Polishing Composition 3B also exhibited a greater blanket TEOS removal rate than the removal rate of Polishing Composition 3D, which did not contain second abrasive particles, and did not exhibit a multimodal particle size distribution. Polishing Composition 3B exhibited a greater blanket removal rate for HDP than that of Polishing Composition 3C. Polishing Compositions 3A and 3B also exhibited reduced WIWNU on both TEOS and HDP as compared to Polishing Composition 3D. In addition, Polishing Composition 3B desirably removed more HDP step height during polishing (i.e., Polishing Composition 3B had less HDP step height remaining after polishing) as compared to Polishing Composition 3D. The remaining HDP step height of Polishing Composition 3B was also comparable to that of Polishing Composition 3C, even though Polishing Composition 3B had lower solids concentration as compared to Polishing Composition 3C.

EXAMPLE 4

This example demonstrates the effectiveness of a polishing composition having first and second abrasive particles and having a multimodal particle size distribution on the removal rate, planarization efficiency, within-wafer non-uniformity (WIWNU), and step height reduction for silicon oxide.

Tetraethoxysilane (TEOS) and high density plasma (HDP) oxide blanket wafers were polished with three polishing compositions (i.e., Polishing Compositions 4A-4C) using a conventional CMP apparatus. Polishing Compositions 4A and

TABLE 3

Blanket Silicon Oxide Removal Rates and WIWNU, and Remaining Silicon Oxide Step Height, as a Function of Abrasive Particles

| Polishing Composition | First Abrasive Particles (wt. %) | Second Abrasive Particles (wt. %) | TEOS Removal Rate | WIWNU | HDP Removal Rate | WIWNU | Remaining HDP Step Height |
|---|---|---|---|---|---|---|---|
| 3A (inventive) | 0.1 | 0.1 | 1.02 | 5.9 | 0.92 | 7.3 | 4.71 |
| 3B (inventive) | 0.15 | 0.05 | 2.15 | 4.9 | 1.97 | 7.3 | 1.15 |
| 3C (comparative) | 12.5 | — | 1 | 3.6 | 1 | 5.1 | 1 |
| 3D (comparative) | 0.2 | — | 1.94 | 12.1 | 2.42 | 8 | 1.77 |

4B contained wet-process ceria having an average particle size of 60 nm (i.e., first abrasive particles) and cationic silica having an average particle size of 10 nm (i.e., second abrasive particles), in the amounts listed in Table 4. Polishing Compositions 4A-4B also contained 500 ppm picolinic acid and water and were pH-adjusted to pH 4 using triethanolamine. Polishing Composition 4C contained 12.5 wt. % fumed silica and water, and was adjusted to pH 10-11 with potassium hydroxide (KOH).

TEOS pattern wafers were also polished for 30 seconds with Polishing Compositions 4A-4C. The TEOS pattern wafers had a 400 μm feature size with 50% density. The substrates were polished with Polishing Compositions 4A-4C under the same polishing conditions. In particular, the substrates were polished on a Mirra™ polisher (Applied Materials) with an IC 1010™ pad (Dow Chemical). The polishing parameters were as follows: 20.68 kPa (3 psi) down force, 100 rpm platen speed, 85 rpm head speed, and 150 mL/min polishing composition flow. Following polishing, the removal rates of the blanket silicon oxide, specifically TEOS and HDP, were determined in Å/min, and the remaining TEOS step heights were determined in Å. The results are summarized in Table 4. The removal rates and remaining step heights shown in Table 4 have been normalized to the removal rates and step height for Polishing Composition 4C.

The within-wafer non-uniformity (WIWNU) was also determined for the chemical-mechanical polishing compositions, and the results are summarized in Table 4.

lower solids concentrations as compared to Polishing Composition 4C.

EXAMPLE 5

This example demonstrates the effectiveness of a polishing composition having first and second abrasive particles and having a multimodal particle size distribution on the removal rate, planarization efficiency, within-wafer non-uniformity (WIWNU), and step height reduction for silicon oxide.

Tetraethoxysilane (TEOS) and high density plasma (HDP) oxide blanket wafers were polished with three polishing compositions (i.e., Polishing Compositions 5A-5C) using a conventional CMP apparatus. Polishing Compositions 5A-5B contained wet-process ceria having an average particle size of 60 nm (i.e., first abrasive particles) and cationic gelatin having an average particle size of 4 nm (i.e., second abrasive particles), in the amounts listed in Table 5. Polishing Compositions 5A-5B also contained 500 ppm picolinic acid and water and were pH-adjusted to pH 4 using triethanolamine. Polishing Composition 5C contained 12.5 wt. % fumed silica and water, and was adjusted to pH 10-11 with potassium hydroxide (KOH).

High density plasma (HDP) oxide pattern wafers were also polished for 30 seconds with Polishing Compositions 5A-5C.

TABLE 4

Blanket Silicon Oxide Removal Rates and WIWNU, and Remaining Silicon Oxide Step Height, as a Function of Abrasive Particles

| Polishing Composition | First Abrasive Particles (wt. %) | Second Abrasive Particles (wt. %) | TEOS Removal Rate | WIWNU | HDP Removal Rate | WIWNU | Remaining TEOS Step Height |
|---|---|---|---|---|---|---|---|
| 4A (inventive) | 0.177 | 0.023 | 1.45 | 7 | 2.61 | 7 | 0.78 |
| 4B (inventive) | 0.177 | 0.2 | 0.66 | 10 | 0.95 | 14 | 1.58 |
| 4C (comparative) | 12.5 | — | 1 | 5.4 | 1 | 6.6 | 1 |

These results demonstrate that a polishing composition comprising first abrasive particles (i.e., wet-process ceria particles having an average particle size of 60 nm) and second abrasive particles (i.e., cationic silica having an average particle size of 10 nm), and having a multimodal particle size distribution (i.e., a bimodal particle size distribution having maxima at 60 nm and 10 nm), is particularly effective for polishing substrates comprising a silicon oxide layer (i.e., TEOS and HDP). In particular, Polishing Composition 4A exhibited blanket removal rates for TEOS and HDP which were greater than the TEOS and HDP removal rates exhibited by Polishing Composition 4C, which contained a greater amount of abrasive particles, but did not contain second abrasive particles, and did not exhibit a multimodal particle size distribution. In addition, Polishing Composition 4A desirably removed more TEOS step height during polishing (i.e., Polishing Composition 4A had less TEOS step height remaining after polishing), even though Polishing Composition 4A had The HDP pattern wafers had a 200 μm feature size with 50% density.

The substrates were polished with Polishing Compositions 5A-5C under the same polishing conditions. In particular, the substrates were polished on a Mirra™ polisher (Applied Materials) with an IC 1010™ pad (Dow Chemical). The polishing parameters were as follows: 20.68 kPa (3 psi) down force, 100 rpm platen speed, 85 rpm head speed, and 150 mL/min polishing composition flow. Following polishing, the removal rates of the blanket silicon oxide, specifically TEOS and HDP, were determined in Å/min, and the remaining HDP step heights were determined in Å. The results are summarized in Table 5. The removal rates and remaining step heights shown in Table 5 have been normalized to the removal rates and step height for Polishing Composition 5C.

The within-wafer non-uniformity (WIWNU) was also determined for the chemical-mechanical polishing compositions, and the results are summarized in Table 5.

TABLE 5

Blanket Silicon Oxide Removal Rates and WIWNU, and Remaning Silicon Oxide Step Height, as a Function of Abrasive Particles

| Polishing Composition | First Abrasive Particles (wt. %) | Second Abrasive Particles (wt. %) | TEOS Removal Rate (Å/min) | WIWNU % | HDP Removal Rate (Å/min) | WIWNU % | Remaining HDP Step Height (Å) |
|---|---|---|---|---|---|---|---|
| 5A (inventive) | 0.2 | 0.01 | 0.76 | 10 | 0.71 | 13 | 0.38 |
| 5B (inventive) | 0.2 | 0.04 | 0.13 | 16 | 0.14 | 31 | 4.03 |
| 5C (comparative) | 12.5 | — | 1 | 5.4 | 1 | 6.6 | 1 |

These results demonstrate that a polishing composition comprising first abrasive particles (i.e. wet-process ceria particles having an average particle size of 60 nm) and second abrasive particles (i.e., cationic gelatin particles having an average particle size of 4 nm), and having a multimodal particle size distribution (i.e., a bimodal particle size distribution having maxima at 60 nm and 4 nm), is particularly effective for polishing substrates comprising a silicon oxide layer (i.e. TEOS and HDP). In particular. Polishing Composition 5A exhibited effective blanket removal rates for TEOS and HDP, and exhibited more step-height removal for HDP (i.e., Polishing Composition 5A had a significantly reduced HDP step height after only 30 seconds of polishing as compared to the remaining HDP step height of Polishing Composition 5C, which contained a greater amount of abrasive particles, but did not contain second abrasive particles, and did not exhibit a multimodal particle size distribution). Desirably, Polishing Composition 5A exhibited an effective but slightly lower removal rate on blanket silicon oxide (i.e., TEOS and HDP), and exhibited a high removal rate on patterned silicon oxide (i.e., HDP).

EXAMPLE 6

This example demonstrates the effectiveness of a polishing composition having first and second abrasive particles and having a multimodal particle size distribution on the removal rate, planarization efficiency, within-wafer non-uniformity (WIWNU), and step height reduction for silicon oxide.

Tetraethoxysilane (TEOS) and high density plasma (HDP) oxide blanket wafers were polished with two polishing compositions (i.e., Polishing Compositions 6A-6B) using a conventional CMP apparatus. Polishing Composition 6A contained wet-process ceria having an average particle size of 60 nm (i.e., first abrasive particles) and wet-process ceria having an average particle size of 30 nm (i.e., second abrasive particles), in the amounts listed in Table 6. Polishing Composition 6A also contained 50 ppm polyMADQUAT and water, and was pH-adjusted to pH 8 using triethanolamine. Polishing Composition 6B contained 12.5 wt. % fumed silica and water, and was adjusted to pH 10-11 with potassium hydroxide (KOH).

High density plasma (HDP) oxide pattern wafers were also polished for 60) seconds with Polishing Compositions 6A and 6B. The HDP pattern wafers had a 200 μm feature size with 50% density.

The substrates were polished with Polishing Compositions 6A and 6B under the same polishing conditions. In particular, the substrates were polished on a Mirra™ polisher (Applied Materials) with an IC 1010™ pad (Dow Chemical). The polishing parameters were as follows: 20.68 kPa (3 psi) down force, 100 rpm platen speed, 85 rpm head speed, and 150 mL/min polishing composition flow. Following polishing, the removal rates of the blanket silicon oxide, specifically TEOS and HDP, were determined in Å/min, and the remaining HDP step heights were determined in Å. The results are summarized in Table 6. The removal rates and remaining step heights shown in Table 6 have been normalized to the removal rates and step height for Polishing Composition 6B.

The within-wafer non-uniformity (WIWNU) was also determined for the chemical-mechanical polishing compositions, and the results are summarized in Table 6.

TABLE 6

Blanket Silicon Oxide Removal Rates and WIWNU, and Remaining Silicon Oxide Step Height, as a Function of Abrasive Particles

| Polishing Composition | First Abrasive Particles (wt. %) | Second Abrasive Particles (wt. %) | TEOS Removal Rate (Å/min) | WIWNU (%) | HDP Removal Rate (Å/min) | WIWNU (%) | Reamaining HDP Step Height (Å) |
|---|---|---|---|---|---|---|---|
| 6A (inventive) | 0.12 | 0.08 | 1.54 | 5.0 | 1.84 | 6.3 | 0.49 |
| 6B (comparative) | 12.5 | — | 1 | 5.4 | 1 | 6.6 | 1 |

These results demonstrate that a polishing composition comprising first abrasive particles (i.e., wet-process ceria particles having an average particle size of 60 nm) and second abrasive particles (i.e., wet-process ceria particles having an average particle size of 30 ran), and having a multimodal particle size distribution (i.e., a bimodal particle size distribution having maxima at 60 nm and 30 nm), is particularly effective for polishing substrates comprising a silicon oxide layer (i.e., TEOS and HDP). In particular, Polishing Composition 6A exhibited blanket removal rates for TEOS and HDP that were faster than the TEOS and HDP removal rates exhibited by Polishing Composition 6B, which contained a greater amount of abrasive particles, but did not contain second abrasive particles, and did not exhibit a multimodal particle size distribution. Polishing Composition 6A also exhibited reduced WIWNU on TEOS and HDP as compared to Polishing Composition 6B. In addition, Polishing Composition 6A desirably removed more HDP step height during polishing (i.e., Polishing Composition 6A had less HDP step height remaining after polishing), even though Polishing Composition 6A had lower solids concentration as compared to Polishing Composition 6B.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) first abrasive particles, wherein the first abrasive particles are ceria particles, and wherein the first abrasive particles have an average particle size of about 50 nm to about 70 nm and are present in the polishing composition at a concentration of about 0.005 wt. % to about 2 wt. %,
   (b) second abrasive particles, wherein the second abrasive particles are ceria particles, surface-modified silica particles, or organic particles, and wherein the second abrasive particles have an average particle size of about 1 nm to about 40 nm and are present in the polishing composition at a concentration of about 0.005 wt. % to about 2 wt. %,
   (c) a functionalized pyridine, benzoic acid, amino acid, or combination thereof,
   (d) a pH-adjusting agent, and
   (e) an aqueous carrier,
   wherein the polishing composition exhibits a multimodal particle size distribution, and
   wherein the pH of the polishing composition is about 3.5 to about 9.

2. The chemical-mechanical polishing composition of claim 1, wherein the second abrasive particles are ceria particles, and wherein the second abrasive particles have an average particle size of about 20 nm to about 40 nm.

3. The chemical-mechanical polishing composition of claim 2, wherein the ratio of the concentration of the first abrasive particles present in the polishing composition to the concentration of the second abrasive particles present in the polishing composition is about 1:1 to about 5:1.

4. The chemical-mechanical polishing composition of claim 1, wherein the second abrasive particles are ceria particles, and wherein the second abrasive particles have an average particle size of about 1 nm to about 15 nm.

5. The chemical-mechanical polishing composition of claim 4, wherein the ratio of the concentration of the first abrasive particles present in the polishing composition to the concentration of the second abrasive particles present in the polishing composition is about 3:1 to about 6:1.

6. The chemical-mechanical polishing composition of claim 1, wherein the second abrasive particles are surface-modified silica particles, and wherein the second abrasive particles have an average particle size of about 1 nm to about 40 nm and wherein the second abrasive particles are cationic silica particles.

7. The chemical-mechanical polishing composition of claim 6, wherein the ratio of the concentration of the first abrasive particles present in the polishing composition to the concentration of the second abrasive particles present in the polishing composition is about 1:1 to about 15:1.

8. The chemical-mechanical polishing composition of claim 1, wherein the second abrasive particles are organic particles selected from gelatin, latex, cellulose, polystyrene, and polyacrylate, and wherein the second abrasive particles have an average particle size of about 1 nm to about 40 nm.

9. The chemical-mechanical polishing composition of claim 8, wherein the second abrasive particles are gelatin particles.

10. The chemical-mechanical polishing composition of claim 8, wherein the ratio of the concentration of the first abrasive particles present in the polishing composition to the concentration of the second abrasive particles present in the polishing composition is about 1:1 to about 30:1.

11. The chemical-mechanical polishing composition of claim 1, wherein the functionalized pyridine, benzoic acid, or amino acid is picolinic acid.

12. The chemical-mechanical polishing composition of claim 1, wherein the pH-adjusting agent is an alkyl amine, an alcohol amine, quaternary amine hydroxide, ammonia, or a combination thereof.

13. The chemical-mechanical polishing composition of claim 12, wherein the pH-adjusting agent is triethanolamine.

14. The chemical-mechanical polishing composition of claim 1, wherein the pH of the polishing composition is about 3.5 to about 5.

15. A chemical-mechanical polishing composition comprising:
(a) first abrasive particles, wherein the first abrasive particles are ceria particles, and wherein the first abrasive particles have an average particle size of about 50 nm to about 70 nm and are present in the polishing composition at a concentration of about 0.005 wt.% to about 2 wt. %,
(b) second abrasive particles, wherein the second abrasive particles are ceria particles, surface-modified silica particles, or organic particles, and wherein the second abrasive particles have an average particle size of about 1 nm to about 40 nm and are present in the polishing composition at a concentration of about 0.005 wt. % to about 2 wt. %,
(c) a polymer additive selected from polyethylene glycol (PEG), polyvinyl alcohol, poly(hydroxyethyl methacrylate), a copolymer of poly(hydroxyethyl methacrylate), cellulose, a cationic dendrimer, a monomer or homopolymer of methacryloyloxyethyl trimethylammonium, or a combination thereof,
(d) a pH-adjusting agent, and
(e) an aqueous carrier,
wherein the polishing composition exhibits a multimodal particle size distribution, and
wherein the pH of the polishing composition is about 6 to about 9.

16. A method of polishing a substrate comprising:
(i) providing a substrate;
(ii) providing a polishing pad;
(iii) providing the chemical-mechanical polishing composition of claim 1;
(iv) contacting the substrate with the polishing pad and the chemical-mechanical polishing composition; and
(v) moving the polishing pad and the chemical-mechanical polishing composition relative to the substrate to abrade at least a portion of the substrate to polish the substrate.

* * * * *